PRINTED CIRCUIT ASSEMBLY WITH INTERCONNECTION MODULES

Filed Aug. 25, 1967 3 Sheets-Sheet 1

INVENTORS:
HAROLD W. ABBOTT,
ADAM E. KLISZ,

BY [signature]
THEIR ATTORNEY.

PRINTED CIRCUIT ASSEMBLY WITH INTERCONNECTION MODULES

Filed Aug. 25, 1967 3 Sheets-Sheet 2

INVENTORS:
HAROLD W. ABBOTT,
ADAM E. KLISZ,
BY Marvin J. Goldenberg
THEIR ATTORNEY.

INVENTORS:
HAROLD W. ABBOTT,
ADAM E. KLISZ,
BY Marvin [signature]
THEIR ATTORNEY.

United States Patent Office 3,486,076

Patented Dec. 23, 1969

3,486,076
PRINTED CIRCUIT ASSEMBLY WITH INTERCONNECTION MODULES

Harold W. Abbott and Adam E. Klisz, Syracuse, N.Y., assignors to General Electric Company, a corporation of New York Filed Aug. 25, 1967, Ser. No. 663,363
Int. Cl. H02b *1/04, 9/00*
U.S. Cl. 317—101 5 Claims

ABSTRACT OF THE DISCLOSURE

A flexible layout assembly capable of providing interconnections for a relatively complex arrangement of electronic circuit components on a single layer circuit board. Novel interconnection modules adapted to be mounted on the board as discrete circuit components supply the crossover connections.

BACKGROUND OF THE INVENTION

Field of the invention

The invention pertains to the field of printed circuit board assemblies, having particular application to micro-miniature integrated circuit fabrication.

Description of the prior art

Printed circuit board construction for providing interconnections between electronic circuit components offer advantages of automated fabrication, lowered cost, reduced size and weight, ruggedness and high reliability. Further, printed circuit assemblies are essential to modern microcircuit technology for providing an interconnection structure compatible with micro-miniature circuit components. However, despite the very considerable development effort that has been expended in this area by workers in the art, the interconnection structure presently available is not entirely satisfactory. The essence of the difficulty resides in the need to accommodate intersecting conductors. The problem becomes particularly acute where a high density of micro-miniature circuit components are to be integrally mounted on a circuit board and a large number of conductor intersections are required.

Much work has been performed with multilayer printed circuit boards, wherein crossing conductors are carried by different layers of the board, which are insulated one from the other. However, as presently fabricated, multilayer boards cannot be readily made to provide a high degree of reliability, in particular with respect to connections between layers. Furthermore, present fabrication processes are relatively complex and uneconomical.

Rather than employ multilayer circuit boards, another approach is to use single layer boards and provide individual wire jumpers which are hand-soldered to the printed circuit conductor runs. However, this technique is not compatible with large scale production and is obviously not a satisfactory solution to the problem.

SUMMARY OF THE INVENTION

Accordingly, it is a primary object of the invention to provide improved means for handling intersecting conductors in a printed circuit assembly.

It is a further object of the invention to apply a novel technique to printed circuit board assemblies which overcomes many of the disadvantages in present day practice pertaining to the accommodation of intersecting conductors.

It is another object of the invention to provide a novel printed circuit board assembly of single layer construction which accommodates in convenient fashion a large number of crossover connections.

It is yet a further object of the invention to provide a novel printed circuit board assembly as above described having particular utility in an integrated circuit application.

It is yet another object of the invention to accomplish the above set forth functions using discrete circuit components for providing interconnection of crossing conductors.

These and other objects of the invention are accomplished employing a single layer circuit board having an array of conductive strips coated on one side thereof for interconnecting circuit components mounted on the reverse side of said board, it being required to provide crossovers between certain conductive strips in order to complete the interconnection structure. The conductive strips required to form intersections are each arranged on the circuit board as a pair of branches connected at one end through said board to the terminals of said circuit components, with the unterminated ends of the branches of each single strip brought in proximity and grouped together with the unterminated ends of the branches of neighboring strips. Interconnection modules, each composed of a plurality of bonded, insulated wire conductors, are mounted on the reverse side of said circuit board, the individual conductors of said modules being connected through said board to the unterminated ends of said branches so as to complete the interconnections of said certain conductive strips.

BRIEF DESCRIPTION OF THE DRAWINGS

The specification concludes with claims particularly pointing out and distinctly claiming the subject matter which is regarded as the invention. It is believed, however, that both as to its organization and method of operation, together with further objects and advantages thereof, the invention may be best understood from the description of the preferred embodiments taken in connection with the accompanying drawings in which:

DESCRIPTION OF THE PREFERRED EMBODIMENTS

Figure 1:
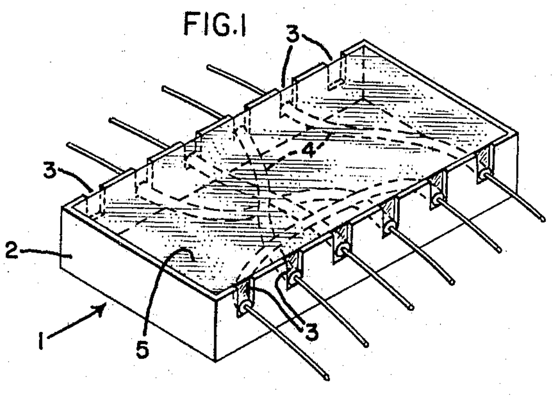
FIGURE 1 is a perspective view of an interconnection module in accordance with the invention.

In FIGURE 1 is illustrated in perspective view an interconnection module 1, in accordance with the invention adapted to be employed in printed circuit assemblies for accommodating crossover connections of the type that must normally be made for interconnecting a plurality of circuit components. The use of such interconnection modules obviates the need for resorting to a multilayer construction of the printed circuit board for accommodating crossovers. They may be mounted to the printed circuit board and electrically connected to the metal conductive strips in precisely the same manner as standard circuit components. The circuit components referred to may be discrete devices or electronic packages of active and passive devices for performing a particular function or subfunction, which would normally be in microminiature form.

The module 1 includes a plastic rectangular housing 2 having slots 3 which are cut from the side walls of said housing. In the embodiment illustrtaed there are six slots cut out in each side wall. It should be appreciated that slots may as well be provided in the end walls. Five insulated wire conductors 4 are shown fitted within the housing, surrounded by a bonding material 5 which secures the conductors in place and supplies further insulation. As is more clearly shown in the plan view of FIGURE 2 wherein a portion of the bonding material 5 has been removed, the conductors 4 extend between selected pairs of the slots 3, thereby providing an arrangement of crossing conductors. The ends of the wires protruding from the housing are stripped to the bare metal for connection to the conductive runs of the printed circuit board.

Figure 2:
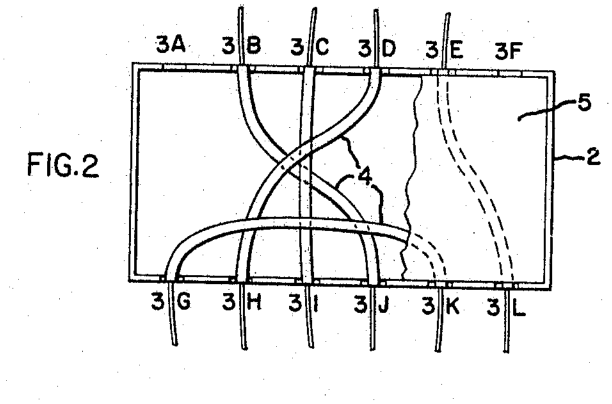
FIGURE 2 is a plan view of the module of FIGURE 1, absent in part the filler material.

In FIGURE 2 the slots are individually identified with additional letter reference characters so that the slots cut in one side wall are identitfied as 3A through 3F, and the slots in the opposite side wall are identified as 3G through 3L. A first wire conductor 4 is connected between slots 3B and 3J; a second conductor is connected between the slots 3C and 3I; a third conductor connects between slots 3D and 3H; a fourth conductor connects between slots 3E and 3L; and a fifth conductor connects between slots 3G and 3K. It is seen that the connections of the conductors 4 provide multilevel intersections. It may be appreciated that the illustrated arrangement of the interconnection module is entirely exemplary and that the number and configuration of the connections for a given insulated wire conductor module will be normally determined as required by individual circuit requirements.

The interconnection module 1 may be conveniently dimensioned as a standard flat pack, .25" wide, .4" long and .1" deep. In one exemplary embodiment the housing was made from a phenolic material. An epoxy filler was employed for bonding puropses. The insulated conductors were .015" standard Formex wire.

Figure 3A:
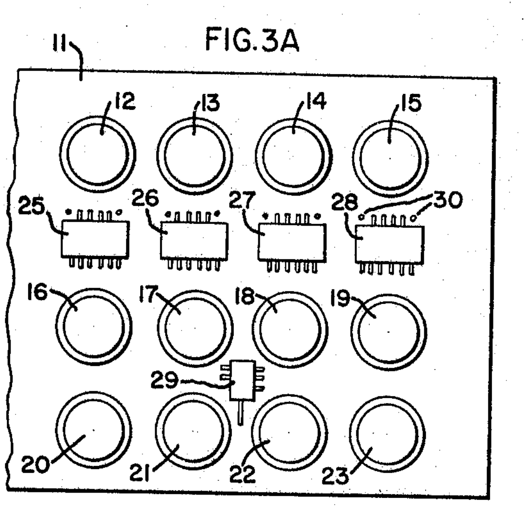
FIGURE 3A is a plan view of the top side of a single layer printed circuit board having mounted thereon several standard circuit components and several interconnection modules.
Figure 3B:
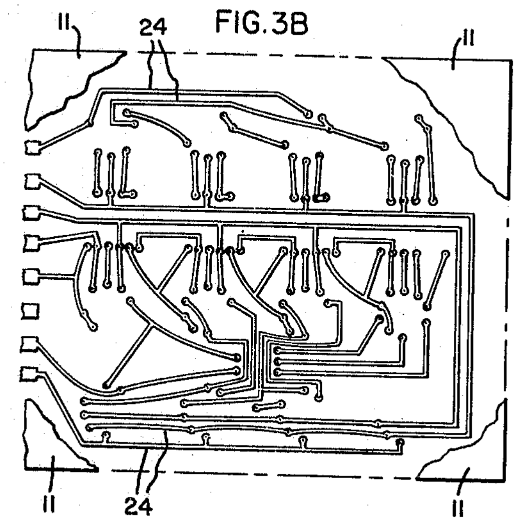
FIGURE 3B is a cut-away plan view of the printed circuit board of FIGURE 3A exposing the printed circuit conductors.

In FIGURES 3A and 3B there is illustrated a printed circuit assembly including a single layer printed circuit board 11 shown in plan view. The board 11 is shown in FIGURE 3A with the circuit components mounted thereon. Included are standard circuit components 12, 13, 14, 15, 16, 17, 18, 19, 20, 21, 22 and 23, which are electronic packages in microminiature form in the embodiment being considered. Interconnection of components 12 to 23 is provided by the printed conductive strips 24 on the reverse side of said board, in combination with interconnection modules 25, 26, 27, 28 and 29. The printed conductive strips 24 are illustrtaed in FIGURE 3B, which corresponds to that of FIGURE 3A but wherein the dielectric board has been cut away from the conductive strips 24 so as to fully expose them and all components have been removed.

The interconnection modules are similar in their basic dimensions and constructed to that illustrated in FIGURES 1 and 2, the conductor configurations in each of the modules conforming with the specific requirements of the circuit. In the example being considered the various circuit components 12 through 23 are connected together to perform a counter operation, which will be briefly described when considering FIGURE 5. The circuit components 12 through 23 and the interconnection modules 25 through 29 are mounted on the circuit board 11 and electrically connected to the metal conductive runs 24 by being plugged into holes 30 provided in the board 11 in a conventional manner.

Figure 4:
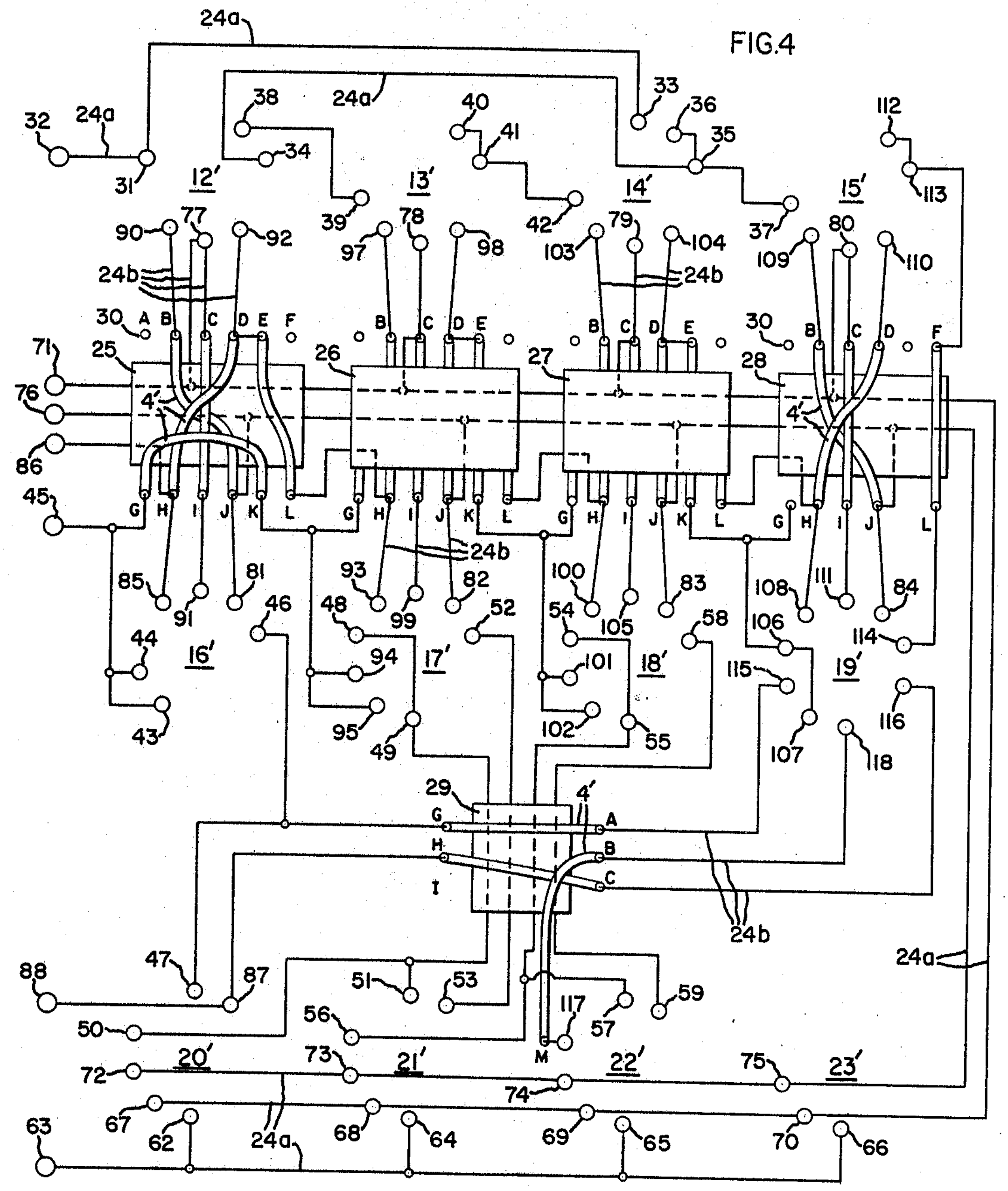
FIGURE 4 is a detailed schematic view similar to that of FIGURE 3B in which the interconnection modules have been added.

Referring now to FIGURE 4, the printed circuit board 11 is schematitcally shown in a view similar to that of FIGURE 3B but in which the interconnection modules 25 through 29 have been added. Positions on the circuit board corresponding to placement of the circuit components 12 through 23 in FIGURE 3A are correspondingly identified, but with an added prime notation. Of the interconnection modules 25 to 29, modules 25, 28 and 29 have the filler material cut away so as to reveal the insulated wire conductors 4'. Modules 26 and 27 are identical to module 25. Each of the circuit component positions 12' through 23' include a plurality of apertured terminals formed integral with the holes 30, to which the circuit components are connected by being plugged in and soldered in accordance with standard practice. Similarly, each of the interconnection module positions include a plurality of apertured terminals to which the modules are connected by being plugged in and soldered. Those conductive strips which connect the various terminals of the circuit components together directly, without a crossover requirement, are identitfied generally as 24*a*. Those conductive strips which are required to intersect other conductive strips in completing their connections, and thereby have their connections completed through interconnection modules 25 through 29, are denoted generally as 24*b*.

Referring now in detail to the specific connections of the circuit components, and first to those that can be made directly at the position 12', terminal 31 is connected by conductors 24*a* to an external terminal 32 of the counter circuit and to terminal 33 at position 14'; similarly, terminal 34 at position 12' is connected to terminals 35 and 36 at position 14' and to terminals 37 at position 15'; terminal 38 at position 12' is connected to terminal 39 at position 13'; terminals 40 and 41 at position 13' are connected together and to terminal 42 at position 14', terminals 43 and 44 at position 16' are connected together and further connected to external terminal 45; terminal 46 at position 16' is connected to terminal 47 at position 20'; terminals 48 and 49 are connected together at position 17' and further connected to terminal 50 at position 20' and 51 at position 21'; terminal 52 at position 17' is connected to terminal 53 at position 21'; terminals 54 and 55 are connected together at position 18' and further connected to terminal 56 at position 21' and terminal 57 at position 22'; terminal 58 at position 18' is connected to terminal 59 at position 22'; terminal 62 at position 20' is connected to external terminal 63 and to terminals 64, 65, 66 at positions 21', 22' and 23', respectively; terminal 67 at position 20' is connected to terminals 68, 69 and 70 at positions 21', 22' and 23', respectively and to external terminal 71, terminal 72 at position 20' is connected to terminals 73, 74 and 75 at positions 21', 22' and 23', respectively and to external terminal 76; terminals 77, 78, 79 and 80 at positions 12', 13', 14' and 15', respectively, are connected to external terminal 71; terminals 81, 82, 83 and 84 at positions 16', 17', 18' and 19', respectively, are connected to external terminal 76; terminal 85 at position 16' is connected to external terminal 86; and terminal 87 at position 20' is connected to external terminal 88.

The remaining connections to be made each have one or more crossover requirements, which are conveniently accommodated by the interconnection modules 25 to 29. Accordingly, terminal 90 at position 12' is connected by conductor 24*b* to terminal B of the interconnection module 25, jumped to terminal J and connected to terminal 81 at position 16'; terminal 77 at position 12' is connected to terminal C of module 25, jumped to terminal I and connected to terminal 91 at position 16'; terminal 92 at position 12' is connected to terminal D of module 25, jumped to terminal H and connected to terminal 85 at position 16'; terminal 92 is further connected to terminal E of module 25, jumped to terminal L and connected through terminal H of module 26 to terminal 93 at position 17'; terminals 43 and 44 at position 16' are connected to terminal G of module 25, jumped to terminal K and connected to terminals 94 and 95 at position 17'. It is noted that in the completion of the connections among positions 12', 16' and 17' multilevel intersections are performed by the interconnection module 25.

Identical connections to those previously recited are made from terminals 97, 78 and 98 at position 13' through interconnection module 26 to terminals 93, 99 and 82 at position 17' and to terminal 100 at position 18, and from terminals 94 and 95 at position 17' to terminals 101 and 102 at position 18'. Identical connections are also made from terminals 103, 79 and 104 at position 14' through interconnection module 27 to terminals 100, 105 and 83 at position 18' and to terminals 106 and 107 at position 19' as well as from terminals 101 and 102 at position 18' to terminal 108 at position 19'.

Terminals 109, 80 and 110 at position 15' are connected through interconection module 28, as shown, to terminals 84, 111 and 108, respectively, at position 19'. Further, terminals 112 and 113 at position 15' are connected to terminal 114 at position 19'.

Terminals 46 and 47 at positions 16' and 20', respectively, are connected to terminal G of interconnection module 29, jumped to terminal A and connected to terminal 115 at position 19'; terminal 87 at position 20' is connected to terminal H of module 29, jumped to terminal C and connected to terminal 116 at position 19'; and terminal 117 at position 22' is connected to terminal M of module 29, jumped to terminal B and connected to terminal 118 of position 19'.

Figure 5:
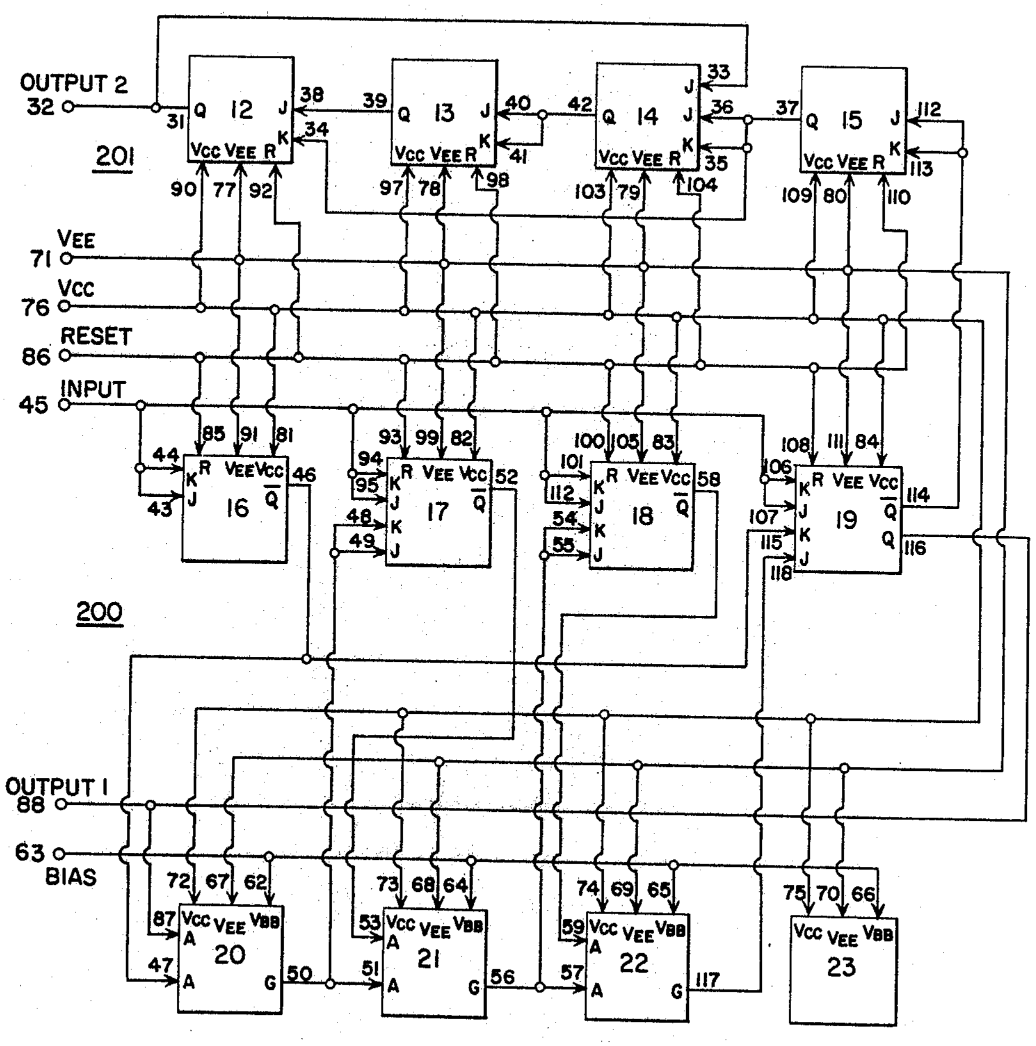
FIGURE 5 is a schematic block diagram of the electrical circuit corresponding to the arrangement of circuit components of FIGURES 3A, 3B and 4.

In FIGURE 5 there is illustrated a schematic block diagram of the counter circuit of FIGURES 3A, 3B and 4 exclusive of the novel interconnection modules. The counter circuit of FIGURE 5 is completely conventional in its construction and operation and is presented merely for the purpose of completing the present disclosure. The circuit includes a synchronous carrier decade counter stage 200, the counter components of which are operated in parallel, and a ripple decade counter stage 201, the components of which are operated in series. Circuit components and terminals are similarly identified as in FIGURES 3A and 4. Accordingly, counter stage 200 includes counter circuit components 16, 17, 18 and 19, logic circuit components 20, 21 and 22 and bias driver circuit component 23. Counter stage 201 includes counter circuit components 12, 13, 14 and 15. The counter circuit components 12 through 19, in the embodiment are consideration, are standard Motorola MC 358 integrated circuits each including a pair of J, K input connections, output connections Q and $\overline{Q}$, a reset connection R, a set connection, and power connections $V_{EE}$ and $V_{CC}$. It is noted that not all of these connections are used in the present circuit. Logic circuit components 20, 21, 22 are standard Motorola MC 356 integrated circuits, each including a pair of input connections A, an output connection G, a bias connection $V_{BB}$ and power connections $V_{EE}$ and $V_{CC}$. Circuit component 23 is a standard Motorola MC 354 bias driver component including connections $V_{EE}$, $V_{CC}$ and $V_{BB}$.

Briefly, counter stage 200 operates as a conventional synchronous carrier decade counter with inputs applied in parallel to the counter components 16 through 19 from external terminal 45, and with further inputs applied from logic gates 20, 21 and 22 to provide a counting operation at ten times the rate of counting stage 201. Counter stage 201 is operated in conventional fashion as a serial decade counter with inputs serially applied to the counter components 15, 14, 13 and 12 in the order recited, an output from component 19 being applied to component 15. Power to the circuit is supplied from external terminals 71 and 76 and a reset signal from terminal 86. Outputs of the circuit occur at terminals 32 and 88, and a bias signal for auxiliary circuitry is provided at terminal 63. Since the circuit configuration and operation of FIGURE 5 is completely conventional, no further description of the individual circuit components and their interaction in the circuit shall be given herein.

The connections illustrated in FIGURE 5 are equivalent to those shown in FIGURE 4, and the terminals of the various circuit components and the external terminals are identified with the same reference characters so that a direct correlation between the two figures can be easily made. From FIGURE 5 can be seen the great number of conductor intersections that are required for interconnecting the circuit components. As has been shown these are readily accommodated by the interconnection modules of the present invention. It is recognized that although a more judicious arrangement of circuit components in FIGURE 5 may reduce the number of crossovers from those shown, in general, the minimum number possible will be a function of the circuit complexity.

Although use of the interconnection modules of the present invention has been described herein with respect to a relatively simple circuit configuration for purposes of example only, it may be appreciated that the modules are extremely useful for relieving interconnection problems for a wide range of circuit configurations and printed circuit applications. Further, the construction of the modules may assume a somewhat different form from that specifically taught without exceeding the basic teaching of the device. For example, the housing may be of a different configuration or may be entirely deleted so that the wire conductors are merely bonded together by a suitable bonding material.

What we claim as new and desire to secure by Letters Patent of the United States is:

1. A printed circuit assembly comprising:
   - (a) a circuit board having printed conductors on one side thereof intended to provide interconnections for circuit components to be mounted on said board, there being a requirement to provide crossovers between certain conductive strips in order to complete the circuit connections, said certain conductive strips each arranged on said board in discontinuous form as a pair of branches, the extreme ends of said branches being connected to said circuit components and the unterminated ends of the branches of each single strip placed in proximity with each other and grouped together with the unterminated ends of the branches of neighboring strips,
   - (b) interconnection means including a plurality of wire conductors insulated from one another and bonded together, and
   - (c) means for connecting said wire conductors to the unterminated ends of said branches so as to complete the connection of each certain conductive strip and thereby complete said circuit interconnections.

2. A printed circuit assembly as in claim 1 wherein said interconnection means are mounted on said circuit board as individual module components.

3. A printed circuit assembly as in claim 2 wherein said module components comprise a plastic housing having slots cut in the walls thereof, said wire conductors arranged within said housing and extending between pairs of said slots.

4. A printed circuit assembly as in claim 3 wherein the lengths of said wire conductors contained within said housing are wrapped in insulation and the ends protruding from said slots are bare metal.

5. A printed circuit assembly as in claim 4 in which said circuit board is a single layer board and said circuit and module components are mounted on the side of said board opposite said one side and connected to said printed conductors through holes formed in said board.

References Cited

FOREIGN PATENTS 206,105 6/1955 Australia.

DARRELL L. CLAY, Primary Examiner

U.S. Cl. X.R.

29—626; 174—68.5; 339—18